(12) United States Patent
Hartman et al.

(10) Patent No.: US 10,281,962 B2
(45) Date of Patent: *May 7, 2019

(54) METHOD FOR CPU/HEATSINK ANTI-TIP AND SOCKET DAMAGE PREVENTION

(71) Applicant: DELL PRODUCTS, L.P., Round Rock, TX (US)

(72) Inventors: Corey D. Hartman, Hutto, TX (US); Lawrence A. Kyle, Saludo, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/893,812

(22) Filed: Feb. 12, 2018

(65) Prior Publication Data
US 2018/0164859 A1    Jun. 14, 2018

Related U.S. Application Data

(63) Continuation of application No. 15/185,900, filed on Jun. 17, 2016, now Pat. No. 9,898,058.

(51) Int. Cl.
| | |
|---|---|
| *G06F 1/20* | (2006.01) |
| *H01L 23/40* | (2006.01) |
| *H01L 21/48* | (2006.01) |
| *H01L 23/367* | (2006.01) |
| *H01L 23/427* | (2006.01) |

(52) U.S. Cl.
CPC ............ *G06F 1/20* (2013.01); *H01L 21/4882* (2013.01); *H01L 23/4006* (2013.01); *H01L 23/4093* (2013.01); *H01L 23/3672* (2013.01); *H01L 23/427* (2013.01)

(58) Field of Classification Search
CPC ............ H01L 23/4093; H01L 23/4006; H01L 21/4882; H01L 23/40; G06F 1/20
USPC ......... 361/704, 709, 719; 257/718, E23.084, 257/E23.086, 706, E23.083; 174/16.3; 248/510
See application file for complete search history.

(56) References Cited

U.S. PATENT DOCUMENTS

| | | | | |
|---|---|---|---|---|
| 5,847,452 A | * | 12/1998 | Tantoush | ............ H01L 23/4006 257/722 |
| 6,097,601 A | * | 8/2000 | Lee | ............ G06F 1/20 165/122 |

(Continued)

*Primary Examiner* — Mandeep S Buttar
(74) *Attorney, Agent, or Firm* — Isidore PLLC

(57) ABSTRACT

An information handling system (IHS) includes a heatsink retention apparatus. A processor mounted on a board receives a heatsink base having peripheral, spaced apertures. At least two latching mechanisms include a mounting portion received respectively in peripheral, spaced apertures on opposites sides of the heatsink base. A latching surface is mounted to one of (i) the heatsink base and (ii) a terminal portion of the mounting portion to engage respectively with either the mounting portion or an upper edge of the corresponding peripheral, spaced aperture of the heatsink base. At least two peripheral, spaced loading screws are sized to be engageable by loading nuts when the heatsink base is positioned not higher than the engagement height. The engaged, at least two, latching mechanisms prevent tipping of the heatsink base during loading of the at least two peripheral, spaced loading screws with the at least two spaced apart loading nuts.

20 Claims, 15 Drawing Sheets

(56) References Cited

U.S. PATENT DOCUMENTS

| | | | |
|---|---|---|---|
| 6,412,546 B1 * | 7/2002 | Lin | H01L 23/3672 165/185 |
| 6,424,527 B1 | 7/2002 | Bailey et al. | |
| 6,611,431 B1 * | 8/2003 | Lee | H01L 23/4006 257/719 |
| 6,809,929 B2 * | 10/2004 | Liu | H01L 21/4882 165/80.2 |
| 6,829,143 B2 * | 12/2004 | Russell | H01L 23/4006 165/80.3 |
| 6,885,557 B2 | 4/2005 | Unrein | |
| 7,068,513 B1 | 6/2006 | Xia et al. | |
| 7,474,532 B1 * | 1/2009 | Desrosiers | H01L 23/4006 165/185 |
| 7,876,566 B1 | 1/2011 | Frisch et al. | |
| 7,983,047 B2 | 7/2011 | Wu | |
| 8,922,999 B2 | 12/2014 | Lai et al. | |

\* cited by examiner

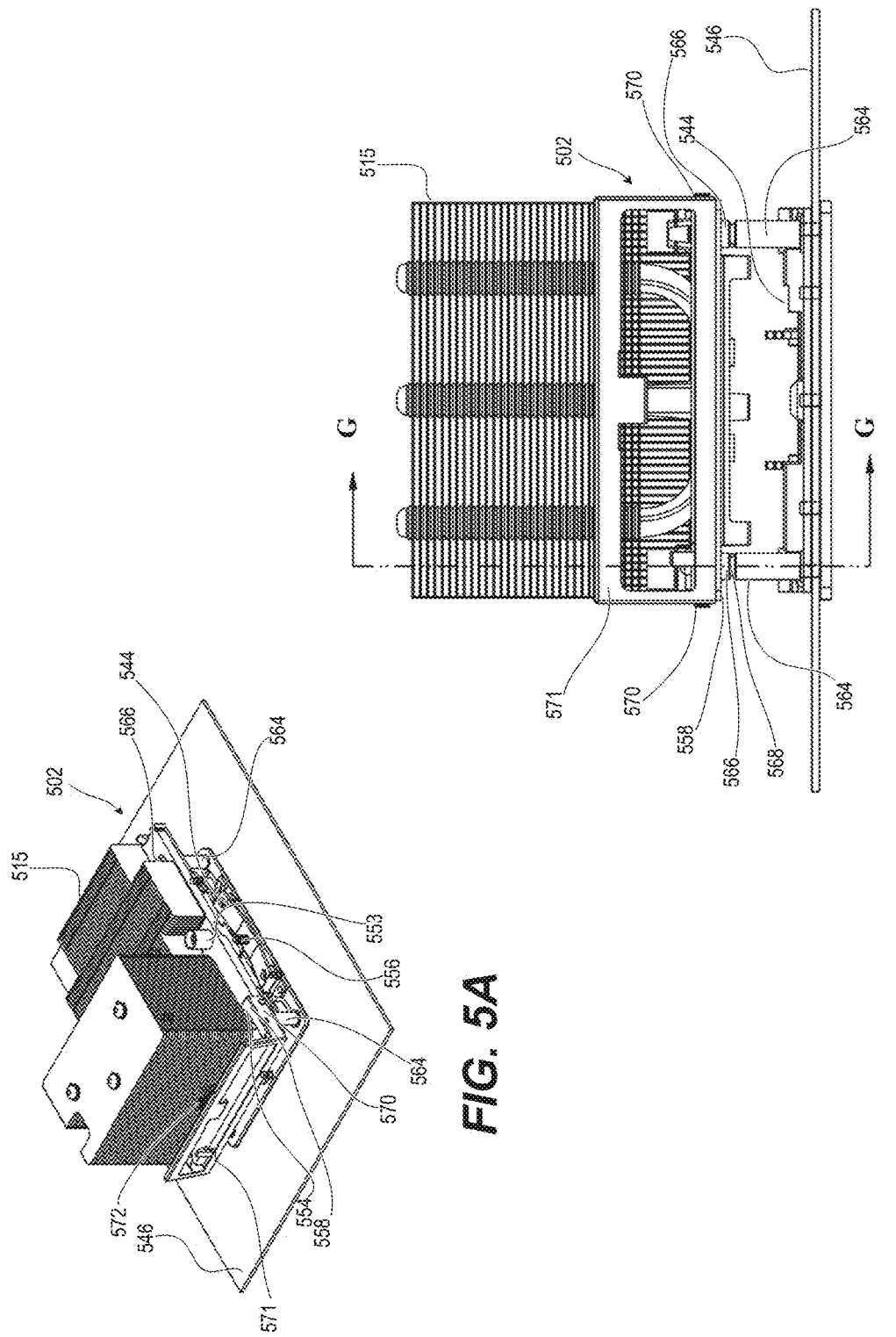

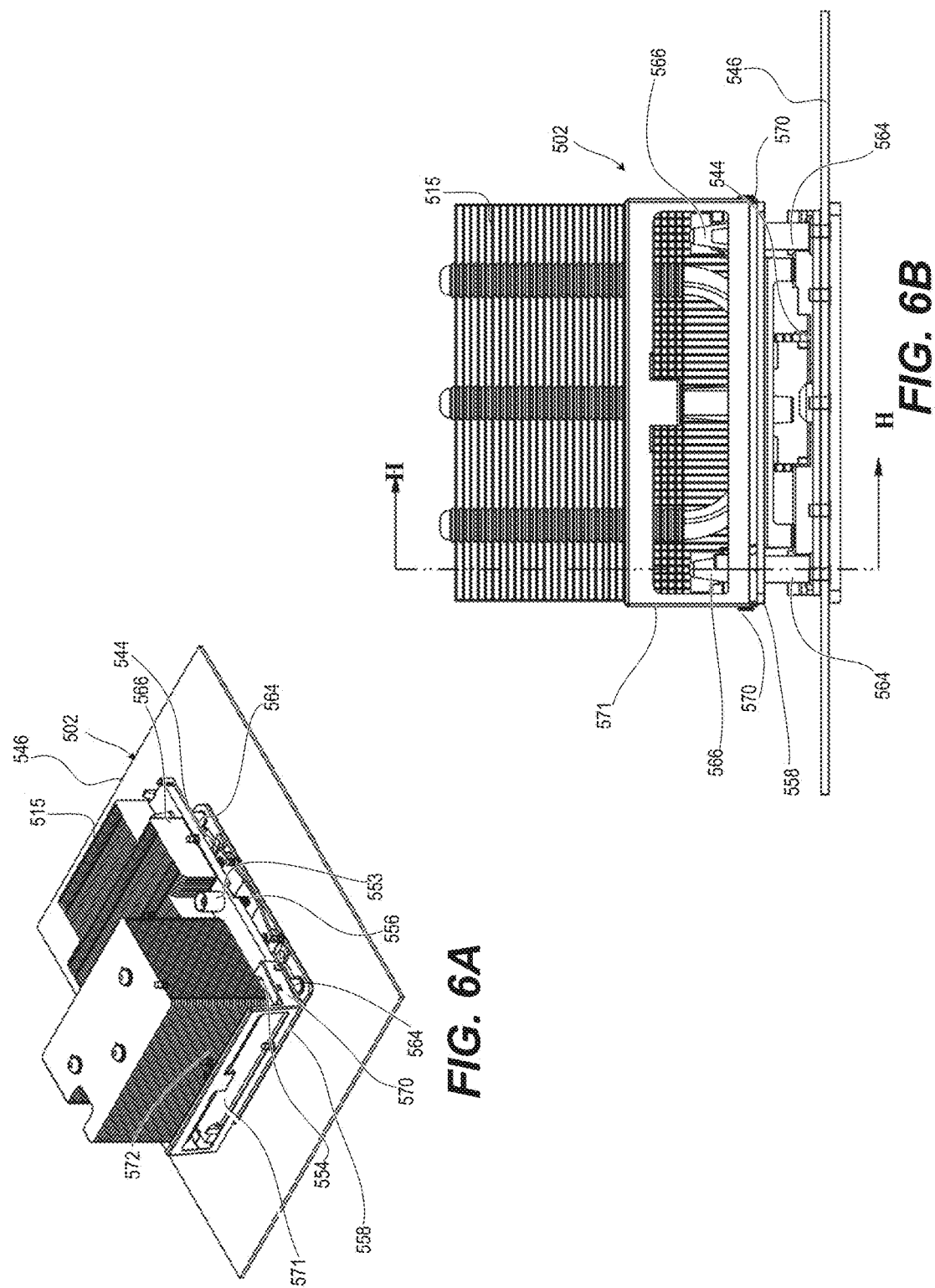

METHOD FOR CPU/HEATSINK ANTI-TIP AND SOCKET DAMAGE PREVENTION

RELATED APPLICATION

This application is a continuation of U.S. patent application Ser. No. 15/185,900, filed Jun. 17, 2016, the content of which is fully incorporated herein by reference.

BACKGROUND

1. Technical Field

The present disclosure relates in general to assembly of heatsinks onto central processing units (CPUs), and more particularly to mounting of heatsink bases that use two loading screws on a board of an information handling system (IHS).

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

A new industry standard method for heatsink and central processor unit (CPU) loading does not include preloading of the CPU. A heatsink base is loaded at only two load points at midpoints of two long edges. When a first load screw is applied, certain tolerance conditions can exist that allow tipping of the heatsink base into a socket that holds the CPU, causing permanent damage. To mitigate this risk, procedural safeguards are required as an industry solution. Primary screws are added to the corners of the heatsink base in a prescribed sequence. Sequencing is also required on removal of the primary screws and the heatsink base. However, a procedural requirement such as sequencing is not a foolproof solution in high volume manufacturing.

BRIEF SUMMARY

In accordance with the teachings of the present disclosure, an information handling system (IHS) includes a heatsink retention apparatus. A processor mounted on a board receives a heatsink base having peripheral, spaced apertures. At least two loading screws are mounted on the board. The loading screws are received respectively in a corresponding pair of the peripheral, spaced apertures on opposite sides of the heatsink base. At least two latching mechanisms include a mounting portion and a latching surface. The mounting portion is mounted to the board. The mounting portion is received, respectively, in another corresponding pair of peripheral, spaced apertures, positioned on opposite sides of the heatsink base. The latching surface is mounted to one of (i) the heatsink base, to engage the mounting portion extending through the corresponding peripheral, spaced aperture, as the heatsink base is lowered to an engagement height relative to the board and (ii) a terminal portion of the mounting portion to engage an upper edge of the corresponding peripheral, spaced aperture of the heatsink base. Each of at least two loading nuts engage a corresponding loading screws. The at least two loading screws are each sized to be engageable by the at least two loading nuts when the heatsink base is positioned not higher than the engagement height. The engaged at least two latching mechanisms prevent tipping of the heatsink base during loading of the at least two loading screws with the at least two loading nuts.

In accordance with embodiments of the present disclosure, a heatsink retention apparatus is provided for mounting a heatsink base having peripheral, spaced apertures onto a processor that is mounted on a board of an IHS. At least two loading screws are mounted on the board. The loading screws are received respectively in a corresponding pair of the peripheral, spaced apertures on opposite sides of the heatsink base. At least two latching mechanisms include a mounting portion and a latching surface. The mounting portion is mounted to the board. the mounting portion is received respectively in another corresponding pair of the peripheral, spaced apertures on opposites sides of the heatsink base. The latching surface is mounted to one of (i) the heatsink base to engage the mounting portion extending through the corresponding peripheral, spaced aperture as the heatsink base is lowered to an engagement height relative to the board and (ii) a terminal portion of the mounting portion to engage an upper edge of the corresponding peripheral, spaced aperture of the heatsink base. At least two loading nuts engage a corresponding one of the at least two loading screws. The at least two loading screws are each sized to be engageable by the at least two loading nuts when the heatsink base is positioned not higher than the engagement height. The engaged latching mechanisms prevent tipping of the heatsink base during loading of the at least two loading screws with the at least two loading nuts.

According to illustrative embodiments of the present disclosure, a method is provided for automated assembling of an IHS board. In one or more embodiments, the method includes forming peripheral, spaced apertures in a heatsink base. The method includes attaching at least two loading screws around a processor on a board of an IHS and positioned to be received respectively in a corresponding pair of the peripheral, spaced apertures on opposite sides of the heatsink base. The method includes attaching a mounting portion of a respective one of at least two latching mechanisms to the board positioned to be received respectively in another corresponding pair of the peripheral, spaced apertures on opposites sides of the heatsink base. The method includes making a latching surface of the respective one of at least two latching mechanisms by a selected one of two approaches: First, the method can include (i) attaching the latching surface to the heatsink base to engage the mounting portion extending through the corresponding peripheral, spaced aperture as the heatsink base is lowered to an engagement height relative to the board. Second, method can include (ii) forming the latching surface on a terminal portion of the mounting portion to engage an upper edge of the corresponding peripheral, spaced aperture of the heatsink base. The method includes positioning the heatsink base over the processor to an engagement position wherein the latching surface is engaged. The method includes engaging at least two loading nuts to a corresponding one of the at least two loading screws. The at least two loading screws are each sized to be engageable by the at least two loading nuts when the heatsink base is positioned not higher than the engagement height. The engaged at least two latching mechanisms prevent tipping of the heatsink base during loading of the at least two loading screws with the loading nuts.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which:

FIG. 5A illustrates an isometric view of a second example heatsink retention apparatus with a handle of the heatsink base positioned at a disengaged position above a board mechanical assembly, according to one or more embodiments;

FIG. 5B illustrates a side view of the second example heatsink retention apparatus of FIG. 5A, according to one or more embodiments;

FIG. 6A illustrates an isometric view of the second example heatsink retention apparatus with the handle of the heatsink base rotated closer to a heatsink by ramping contact with a mounting stud, according to one or more embodiments;

FIG. 6B illustrates a side view of the second example heatsink retention apparatus of FIG. 6A, according to one or more embodiments;

DETAILED DESCRIPTION

Figure 1:
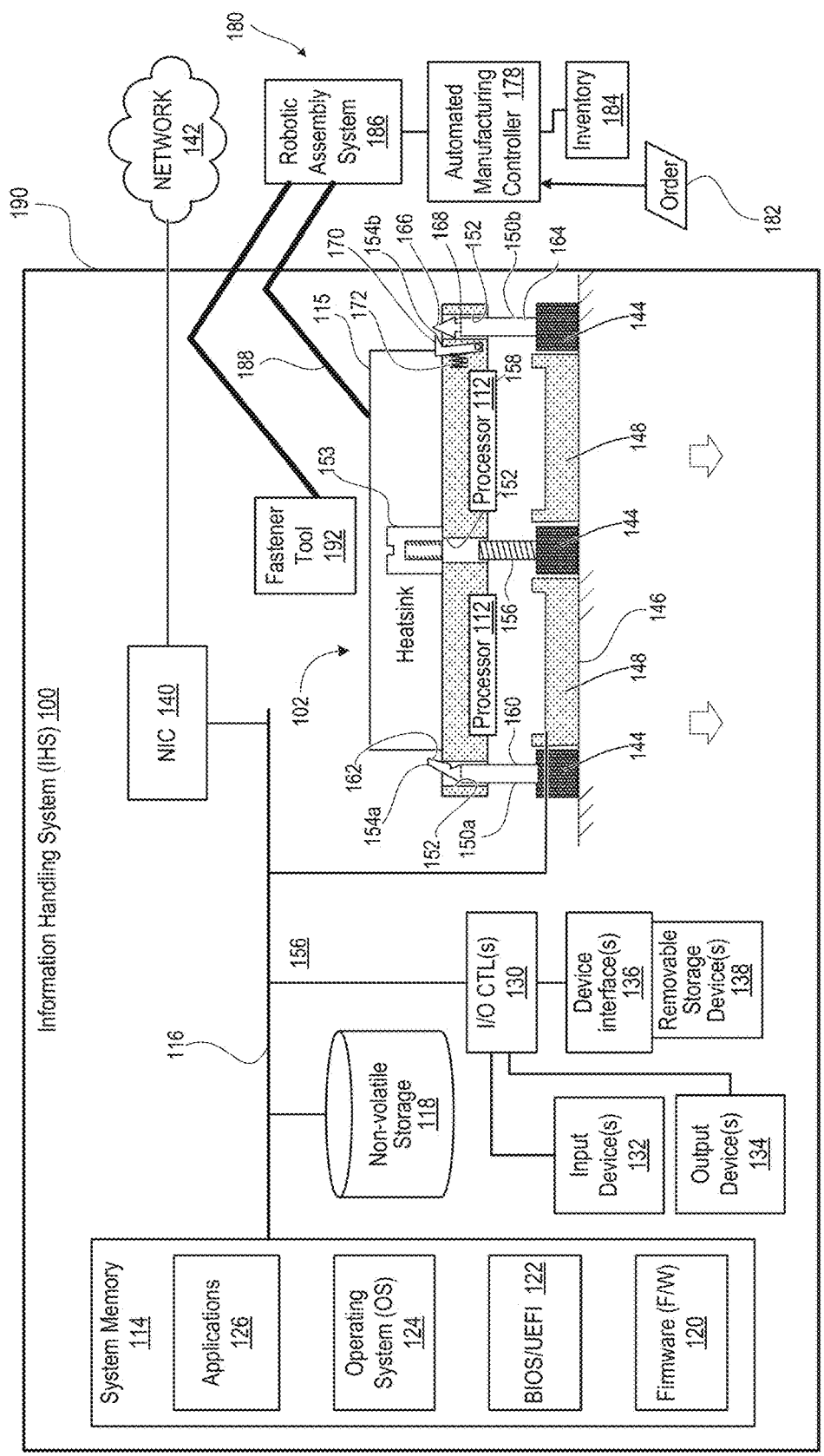
FIG. 1 illustrates a block diagram of an information handling system (IHS) having a heatsink retention apparatus assembled on a IHS board by an automated manufacturing system, according to one or more embodiments.

A heatsink retention apparatus and method of automated assembly of an information handling system (IHS) board for an IHS that prevents tipping of a heatsink during mounting to a central processing unit (CPU), and thus prevent damage to the CPU socket by incorporating an automatic latching mechanism. In one embodiment, the latching mechanism includes a continuous mechanical cantilevered beam that passes through an aperture in the heatsink base and engages an upper edge of the aperture. In one embodiment, the latching mechanism is a latching arm mounted to the heatsink base that allows a mounting stud to pass through an aperture in the heatsink base. When the heatsink base is fully seated on the CPU, the fully inserted mounting stud exposes a mounting feature such as a groove that receives the spring-loaded latching arm for engagement. Positioning of a heatsink base onto the CPU causes at least two latching mechanisms to automatically engage between the heatsink base and the board. Loading of at least two loading screws can only occur after the engagement of the at least two latching mechanisms. Tipping of the heatsink base by loading a first of the at least two loading screws is prevented by the at least two latching mechanisms.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

FIG. 1 illustrates a block diagram representation of an example information handling system (IHS) 100 that has a heatsink retention apparatus 102. Within the general context of IHSs, an IHS 100 may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network storage device, or any other suitable device and may vary in size, shape, performance, functionality, and price. The IHS may include memory, one or more processing resources such as a CPU or hardware or software control logic. Additional components or the IHS may include one or more storage devices, one or more communications ports for communicating with external devices as well as various input and output (I/O) devices, such as a keyboard, a mouse, and a video display. The IHS may also include one or more buses operable to transmit communication between the various hardware components. It is appreciated that the IHS described within the present disclosure is a Large-Scale Information Handling System (LIHS), with servers acting as the individual processing units.

IHS 100 includes at least one CPU or processor/s 112 coupled to a system memory 114 via a system interconnect 116. Due to the thermal energy generating characteristics of the processor/s 112, the processor/s 112 are mounted to a heatsink 115 to absorb and transfer the excess thermal energy. System interconnect 116 can be interchangeably referred to as a system bus, in one or more embodiments. Also coupled to system interconnect 116 is non-volatile storage (e.g., a non-volatile random access memory (NVRAM)) 118, within which can be stored one or more software and/or firmware modules and one or more sets of data that can be utilized during management operations of IHS 100. These one or more software and/or firmware modules can be loaded into system memory 114 during operation of management IHS 100. Specifically, in one embodiment, system memory 114 can include therein a plurality of such modules, including one or more of firmware (F/W) 120, basic input/output system (BIOS) or Uniform Extensible Firmware Interface (UEFI) 122, operating system (OS) 124, and application(s) 126. These software and/or firmware modules have varying functionality when their corresponding program code is executed by processor 112 or secondary processing devices within management IHS 100. For example, application(s) 126 may include a word processing application, a presentation application, and/or a management station application, among other applications.

IHS 100 further includes one or more input/output (I/O) controllers 130 which support connection by, and processing of, signals from one or more connected input device(s) 132, such as a keyboard, mouse, touch screen, or microphone. I/O controllers 130 also support connection to, and forwarding of, output signals to one or more connected output devices 134, such as a monitor or display device or audio speaker(s). Additionally, in one or more embodiments, one or more device interfaces 136, such as an optical reader, a USB, a card reader, Personal Computer Memory Card International Association (PCMCIA) slot, and/or a high-definition multimedia interface (HDMI), can be associated with IHS 100. Device interface(s) 136 can be utilized to enable data to be read from, or stored to, corresponding removable storage device(s) 138, such as a compact disk (CD), digital video disk (DVD), flash drive, or flash memory card. In one or more embodiments, device interface(s) 136 can further include general purpose I/O interfaces such as inter-integrated circuit (I²C), system management bus (SMB), and peripheral component interconnect (PCI) buses.

IHS 100 comprises a network interface controller (NIC) 140. NIC 140 enables IHS 100 and/or components within IHS 100 to communicate and/or interface with other devices, services, and components that are located external to IHS 100. These devices, services, and components can interface with IHS 100 via an external network, such as example network 142. According to one aspect of the disclosure, NIC 140 represents a communication mechanism that enables the IHS to communicate with one or more clients, as described in greater detail hereinafter. Network 142 can be a local area network, wide area network, personal area network, and the like, and the connection to and/or between network 142 and IHS 100 can be wired or wireless or a combination thereof. For purposes of discussion, network 142 is indicated as a single collective component for simplicity. However, it should be appreciated that network 142 can comprise one or more direct connections to other devices as well as a more complex set of interconnections as can exist within a wide area network, such as the Internet.

IHS 100 further includes heatsink retention apparatus 102. Heatsink retention apparatus 102 can include a board mechanical assembly 144 that is attached to an IHS board 146 around CPU socket/s 148 that each contain at least one processor 112. The board mechanical assembly 144 includes mounting portions 150a-150b of the heatsink retention apparatus 102 that are received with peripheral, spaced apertures 152 vertically formed around a periphery of a heatsink base 158 that supports a heatsink 115. Mounting portions 150a-150b surround an area of IHS board 146 that contains CPU socket/s 148. At least two loading screws 156 are also attached to board mechanical assembly 144 and aligned to pass through corresponding peripheral, spaced apertures 152 for loading engagement by captive loading nuts 153. A latching surface 154a-154b forms an engagement between corresponding mounting portions 150a-150b and heatsink base 158.

In one embodiment, mounting portion 150a and latching surface 154a are attached as part of a continuous mechanical cantilever beam 160 formed from an elastic material such as a polymer plastic. Mounting portion 150a has a ramped tip 162 that is aligned to enter the corresponding peripheral, spaced aperture 152. With further insertion, the ramped tip 162 is deflected by a contacting side of peripheral, spaced aperture 152. With continued insertion, the ramped tip 162 reaches an engagement position exposing latching surface 154a above heatsink base 158. At the engagement position, the latching surface 154a engages an upper surface of heatsink base 158 proximate to the corresponding peripheral, spaced aperture 152. In an exemplary embodiment, two continuous mechanical cantilever beams 160 are positioned on opposite corners of board mechanical assembly 144. Thus, manual removal of heatsink base 158 can be enabled by manually deflecting each latching surface 154a from engagement with the upper edge of the corresponding peripheral, spaced aperture 152. Rigid mounting guides 255 (FIG. 2A) can be attached to board mechanical assembly 144 and aligned to pass through other peripheral, spaced apertures 152, such as the other two opposite corners for a rectangularly shaped heatsink base 158.

In one embodiment, mounting portion 150b can be part of a rigid mounting stud 164 formed of metal and having a tapered, conical tip 166 above an engagement feature 168 such as an annular groove. The tapered, conical tip 166 can enter a corresponding, slightly off-center peripheral, spaced aperture 152 and cause centering of the heatsink base 158 as the closely fitting mounting portion 150b enters the corresponding peripheral, spaced aperture 152. Latching surface 154b is provided by a latching arm 170 that is pinned to a side of heatsink base 158. Latching arm 170 is biased by a horizontal compression spring 172 in contact with conical tip 166 of mounting stud 164.

For clarity, FIG. 1 illustrates two embodiments of a heatsink retention apparatus 102. Due to clearance of other design issues, such variations can coexist for a particular IHS board 146. In other embodiments, a singular type of heatsink retention apparatus 102 would be used for certain IHS boards 146. In addition, certain embodiments of a heatsink retention apparatus 102 can lend themselves to manual use as compared to automated or robotic fabrication and assembly. Each embodiment does not rely on a procedure to avoid inadvertent damage during manual installation of a heatsink 115. The automatic engagement can also assist in automated assembly. The heatsink base 158 need not be held when switching to a means of fastening the locking screws 156. For example, an automated manufacturing controller 178 of an automated manufacturing system 180 can respond to an order 182 by executing instructions that directs assembly of at least an IHS board 146 of the IHS 100. Automated manufacturing controller 178 can select an appropriate board mechanical assembly 144 and heatsink base 158 from an automated inventory system 184 according to the order 182. A robotic assembly system 186 can include a manipulator 188 that sequentially positions the board mechanical assembly 144 and heatsink base 158 within a chassis 190 of IHS 100 and fastens board mechanical assembly 144 and heatsink base 158 to IHS board 146 using a fastener tool 192.

Figure 2A:
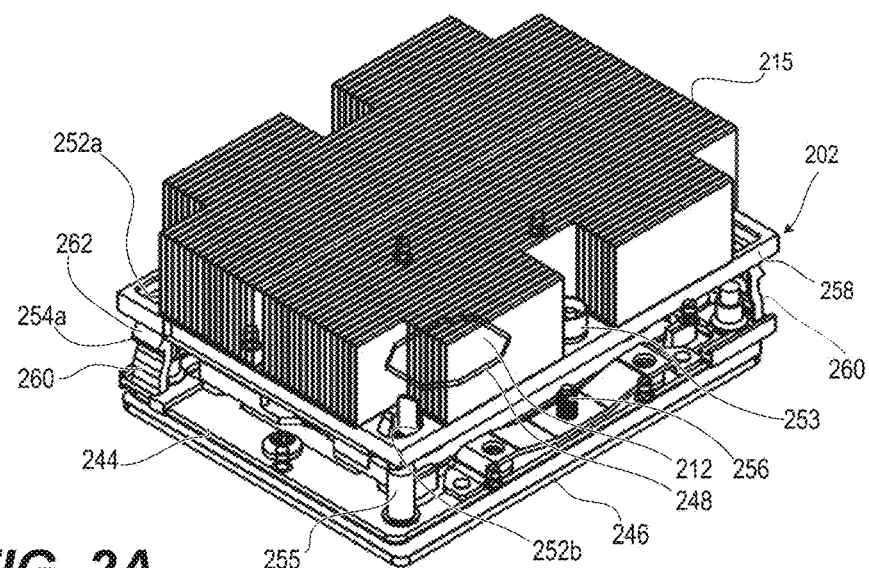
FIG. 2A illustrates an isometric view of a first example heatsink apparatus with a heatsink base positioned at a disengaged position above a board mechanical assembly attached to an IHS board around a central processing unit (CPU) socket, according to one or more embodiments.
Figure 2B:
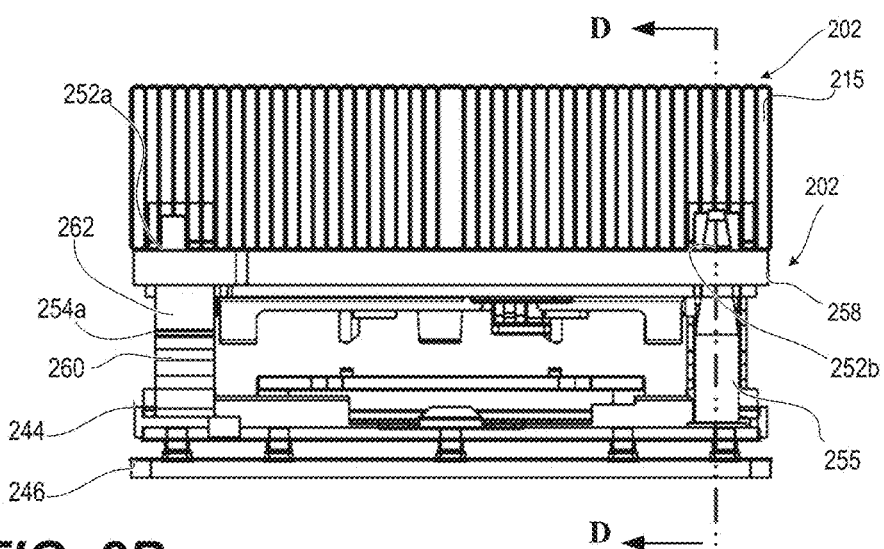
FIG. 2B illustrates a side view of the first example heatsink retention apparatus of FIG. 2A, according to one or more embodiments.
Figure 2C:
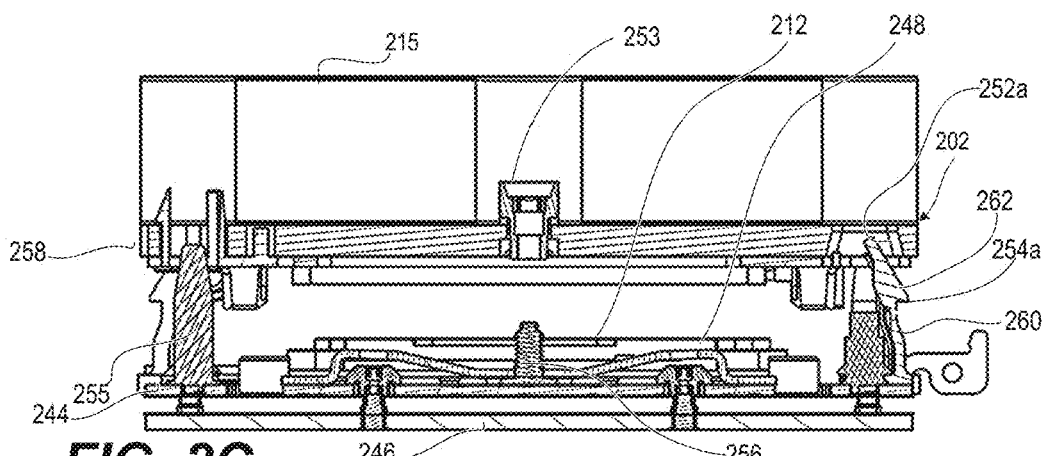
FIG. 2C illustrates a front view in cross section of the first example heatsink retention apparatus of FIG. 2B taken along lines D-D, according to one or more embodiments.

FIGS. 2A-2C, 3A-3C, and 4A-4C illustrate a heatsink retention apparatus 202 having two or more continuous mechanical cantilever beams 260 that automatically engage square apertures 252a on two opposite corners of a heatsink base 258 having a heatsink 215. The other two corners have round apertures 252b that receive rigid mounting guides 255 to assist in centering the heatsink base 258. Continuous cantilever beams 260 and rigid mounting guides 255 are attached to a board mechanical assembly 244 that in turn is fastened to IHS board 246. Board mechanical assembly 244 surrounds CPU socket 248. FIGS. 2A-2C illustrate heatsink base 258 lowered to a first position relative to IHS board 246. The guiding features, such as ramped tip 262 of cantilever beam 260 and mounting guides 255, begin to enter corresponding apertures 252a-252b, respectively, in the heatsink base 258. Latching surface 254a is positioned close to an outward edge of the corresponding peripheral, spaced aperture 252a. Heatsink base 258 is spaced above CPU socket 248 that supports a processor 212 (FIG. 2A). Loading screws 256 are spaced farther away from heatsink base 258 and cannot engage captive loading nuts 253.

Figure 3A:
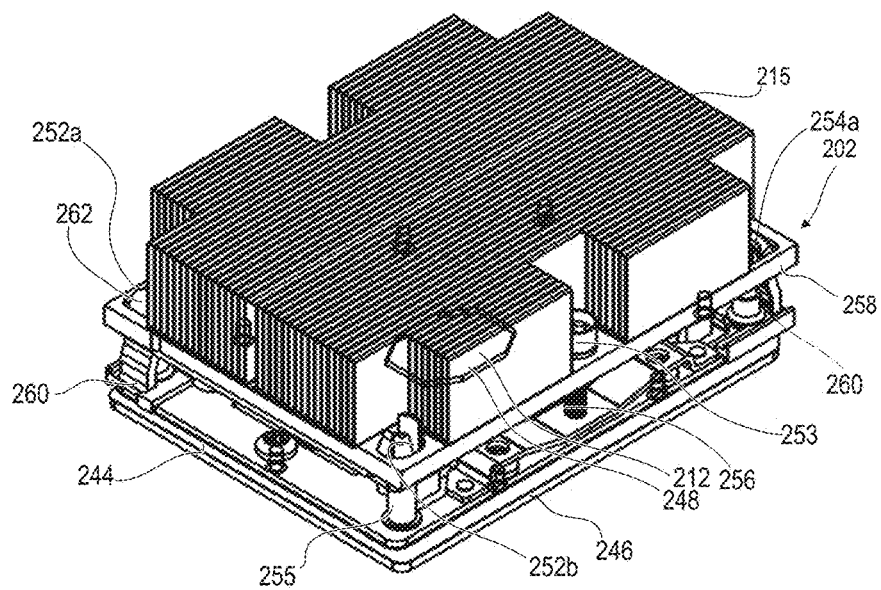
FIG. 3A illustrates an isometric view of the first example heatsink retention apparatus with the heatsink base in a lowered but still disengaged position to the board mechanical assembly, according to one or more embodiments.
Figure 3B:
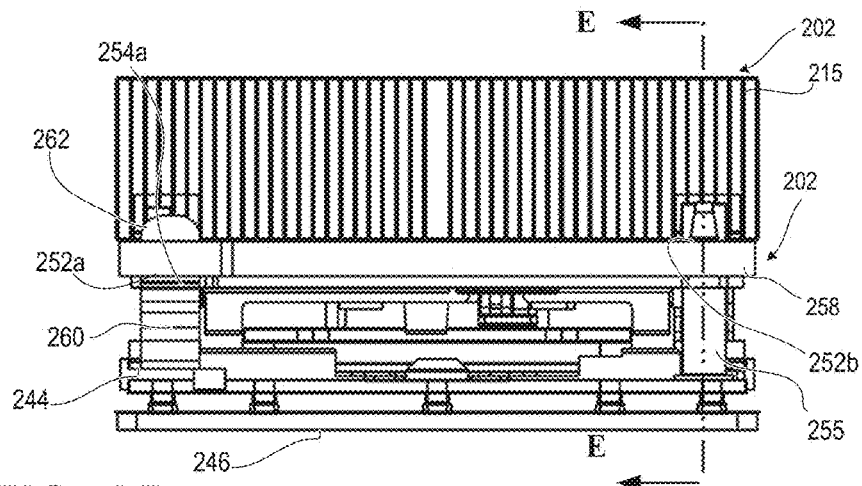
FIG. 3B illustrates a side view of the first example heatsink retention apparatus of FIG. 3A, according to one or more embodiments.
Figure 3C:
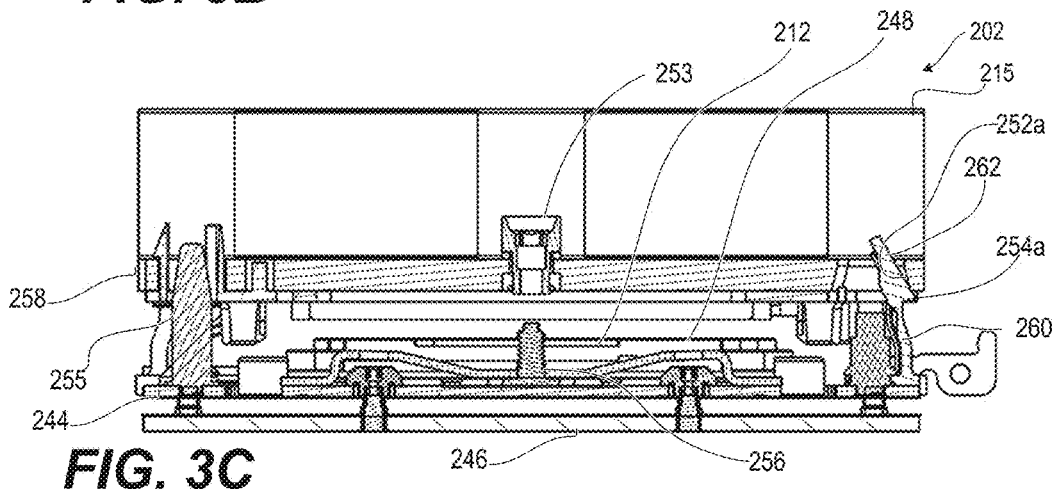
FIG. 3C illustrates a front view in cross section of the first example heatsink retention apparatus of FIG. 3B taken along lines E-E, according to one or more embodiments.

FIGS. 3A-3C illustrate heatsink base 258 lowered to a second position closer to IHS board 246 than the first position. Mechanical cantilever beams 260 are elastically urged into deflecting contact with the corresponding peripheral, spaced aperture 252a. Heatsink base 258 is aligned for contact with CPU socket 248.

Figure 4A:
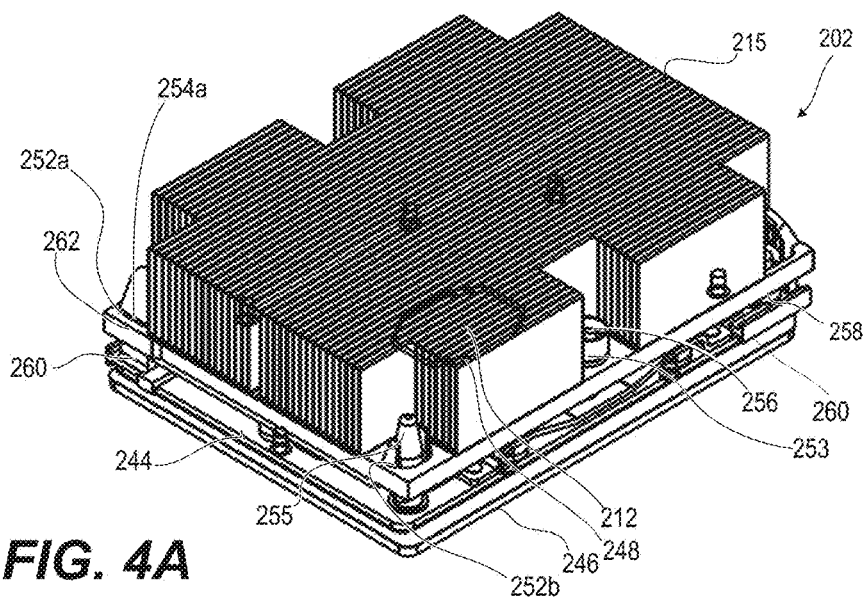
FIG. 4A illustrates an isometric view of the first example heatsink retention apparatus with the heatsink base lowered to an engaged position to the board mechanical assembly enabling loading of captive loading nuts to loading screws, according to one or more embodiments.
Figure 4B:
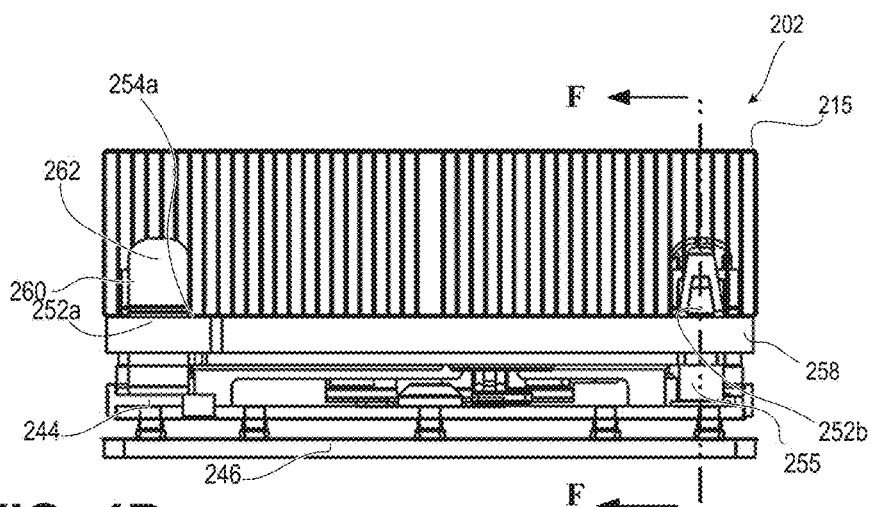
FIG. 4B illustrates a side view of the first example heatsink retention apparatus of FIG. 4A, according to one or more embodiments.
Figure 4C:
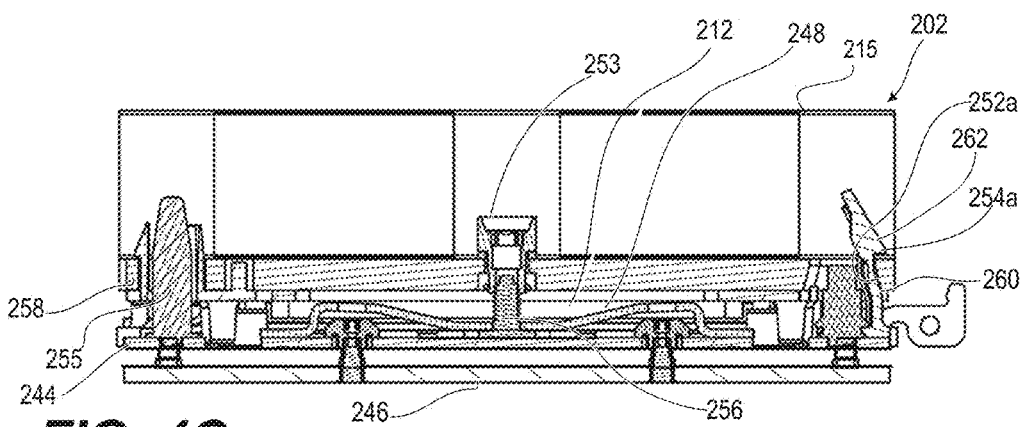
FIG. 4C illustrates a front view in cross section of the first example heatsink retention apparatus of FIG. 4B taken along lines F-F, according to one or more embodiments.

FIGS. 4A-4C illustrate heatsink base 258 lowered to a third position, or "engagement position", closer to IHS board 246 than the second position. Heatsink base 258 and the associated assembly with processor 212 are positioned at the engagement height, such that (i) CPU contacts are started, (ii) heatsink-to-CPU thermal interface has started, and (iii) and final loading can begin. Latching surface 254a extends above aperture 252a and can passively and automatically engage heatsink base 258. At the engagement position, loading screws 256 contact captive loading nuts 253. With heatsink base 258 held at two opposite corners to the IHS board 246, loading nuts 253 can be fastened to corresponding loading screws 256, creating a loaded condition between heatsink base 258, processor 212, and CPU socket 248 thereby enhancing thermal conduction to heatsink 215. With the heatsink/cpu assembly now prevented from tipping by the heatsink retention apparatus 202, one loading nut 253 can be individually, fully tightened without causing damage. A procedure is not required to tighten each loading nut 253 only a portion of the travel at a time in a sequence.

Figure 5C:
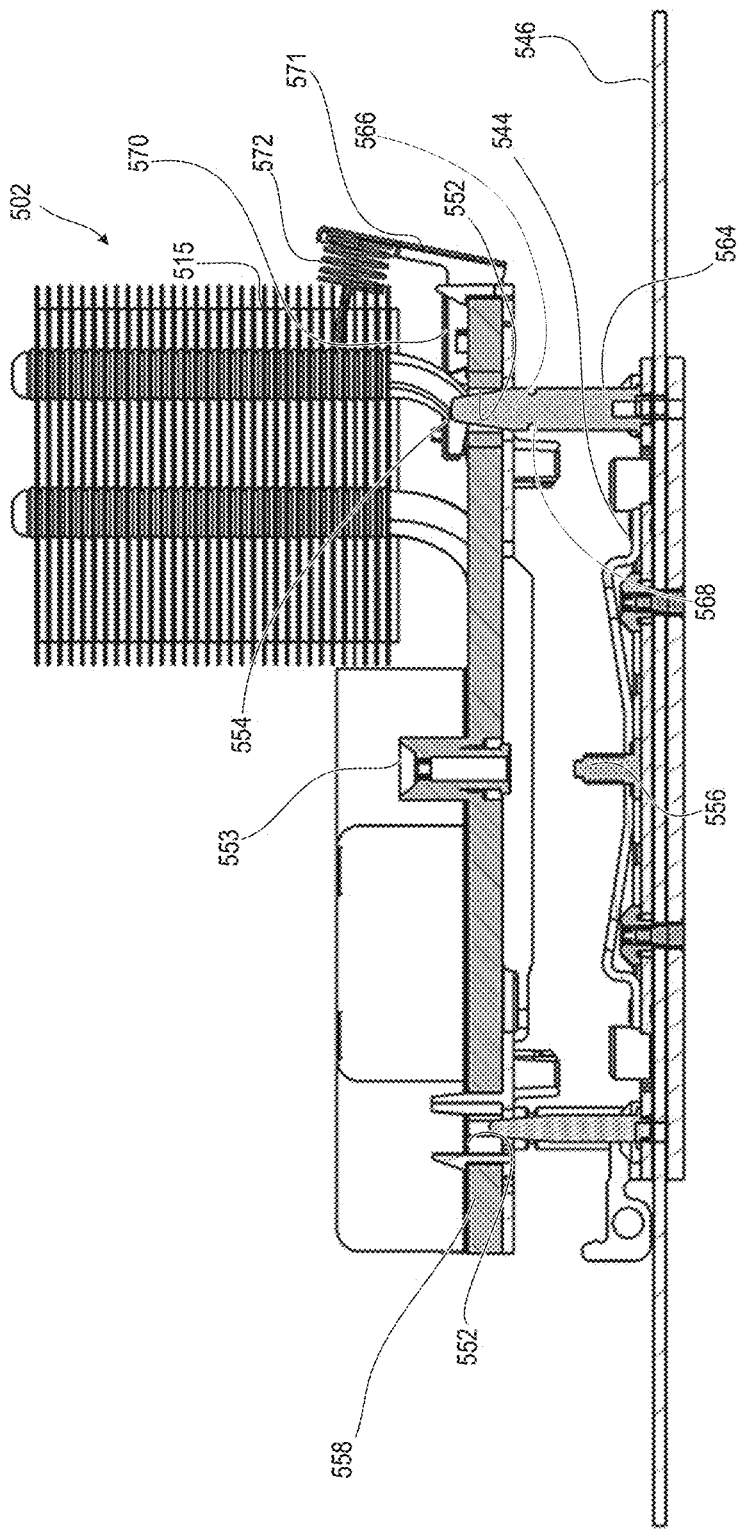
FIG. 5C illustrates a front view in cross section of the second example heatsink retention apparatus of FIG. 5B taken along lines G-G, according to one or more embodiments.
Figure 6C:
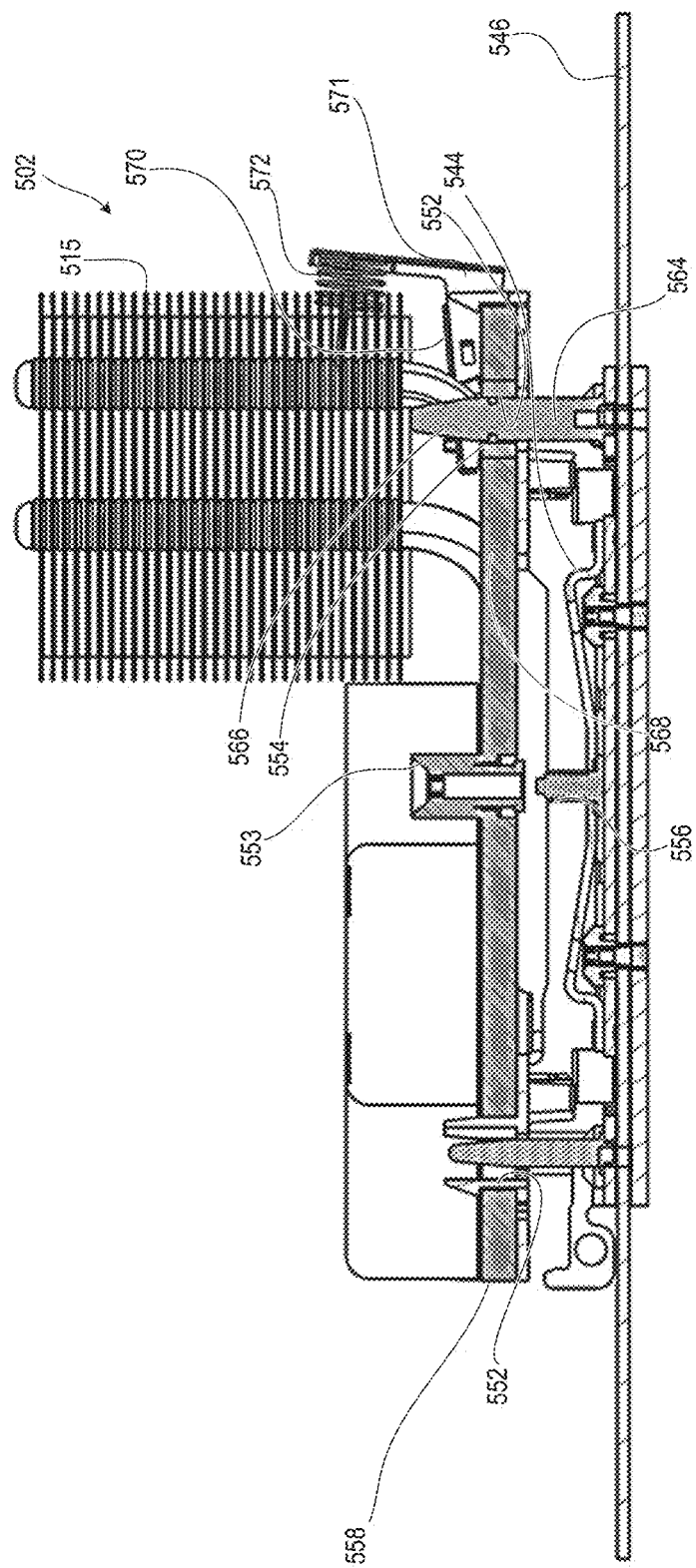
FIG. 6C illustrates a front view in cross section of the second example heatsink retention apparatus of FIG. 6B taken along lines H-H, according to one or more embodiments.
Figure 7A:
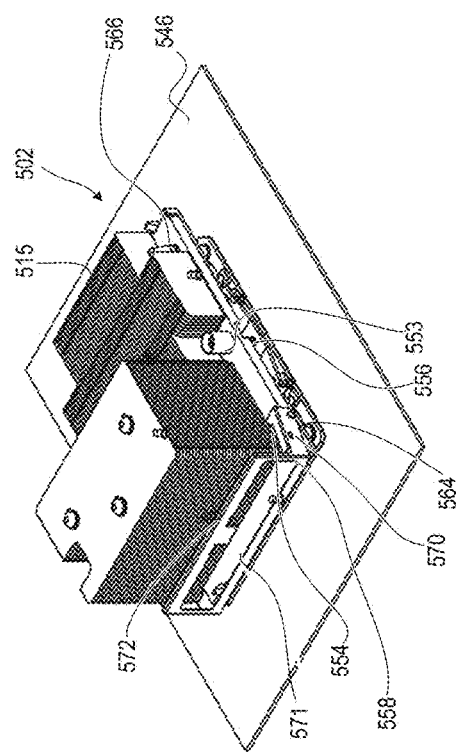
FIG. 7A illustrates an isometric view of the second example heatsink retention apparatus with the handle of the heatsink base fully rotated toward the heatsink by further ramping contact with the mounting stud, according to one or more embodiments.
Figure 7B:
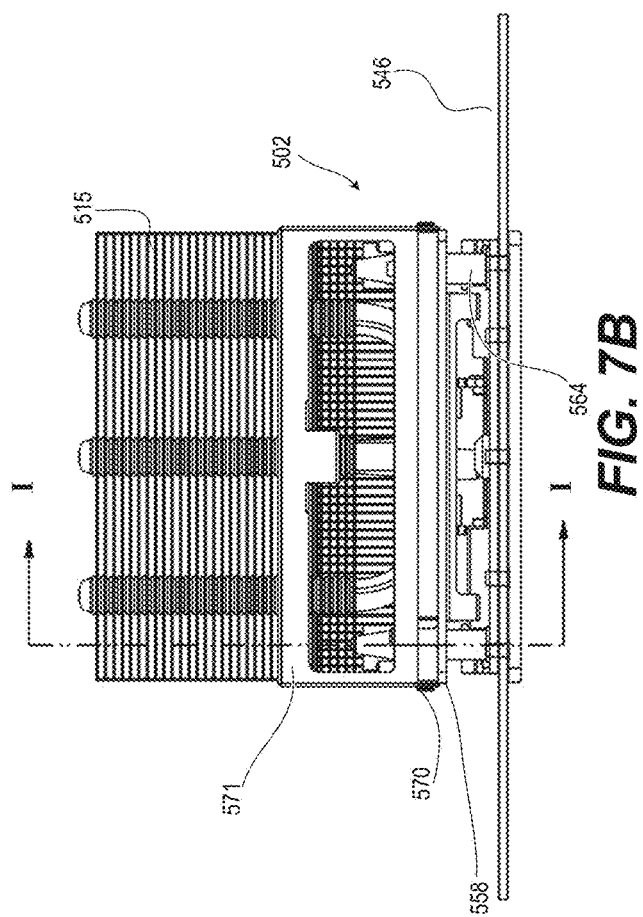
FIG. 7B illustrates a side view of the second example heatsink retention apparatus of FIG. 7A, according to one or more embodiments.
Figure 7C:
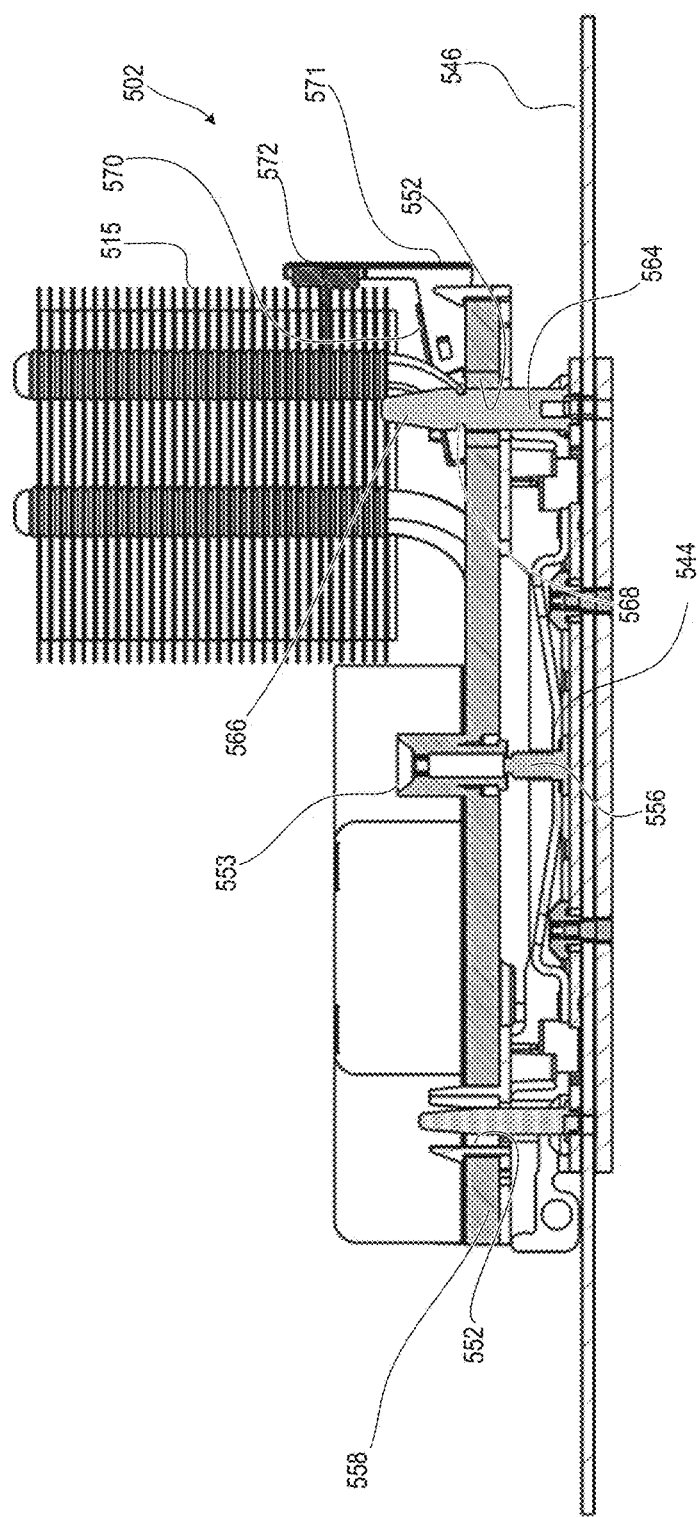
FIG. 7C illustrates a front view in cross section of the second example heatsink retention apparatus of FIG. 7B taken along lines I-I, according to one or more embodiments.
Figure 8A:
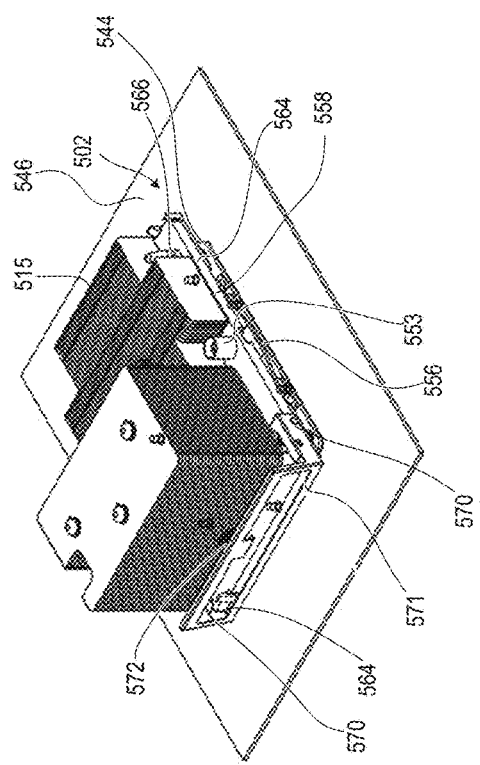
FIG. 8A illustrates an isometric view of the second example heatsink retention apparatus with the handle of the heatsink base rotating away from the heatsink as a latching surface engages a groove in the mounting stud, enabling loading of two captive load nuts, according to one or more embodiments.
Figure 8B:
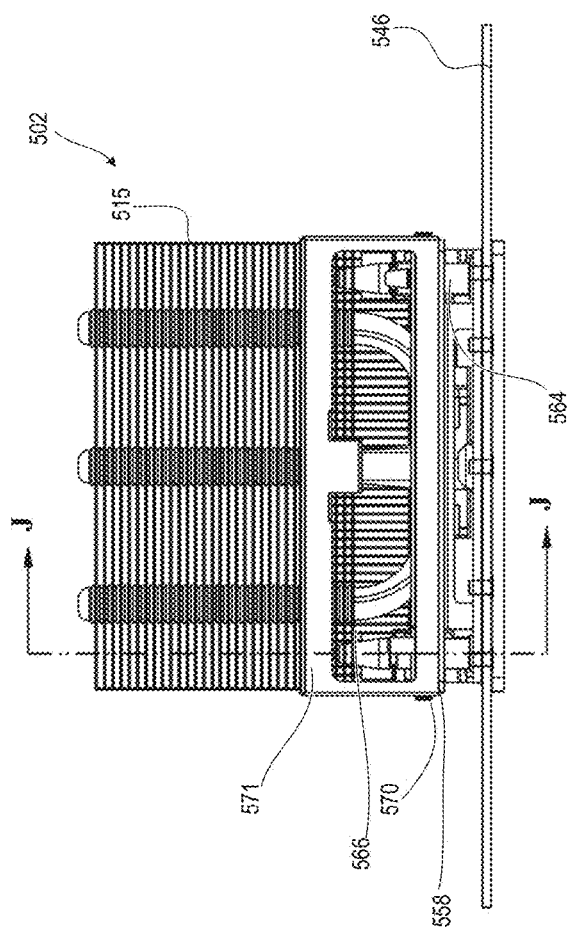
FIG. 8B illustrates a side view of the second example heatsink retention apparatus of FIG. 8A, according to one or more embodiments.
Figure 8C:
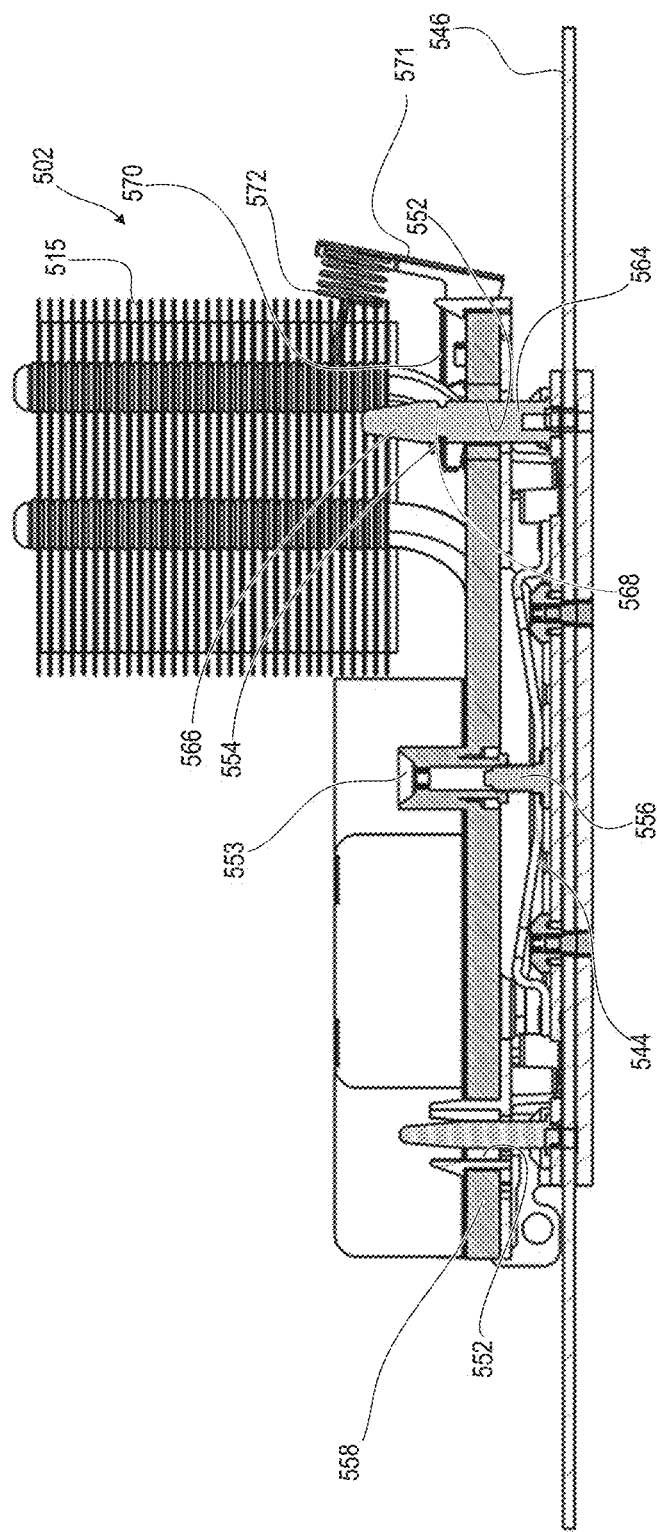
FIG. 8C illustrates a front view in cross section of the second example heatsink retention apparatus of FIG. 8B taken along lines J-J, according to one or more embodiments.

FIGS. 5A-5C, 6A-6C, 7A-7C and 8A-8C illustrate different embodiments of a heatsink retention apparatus 502 having a first pair of spring-loaded latch arms 570 pinned for pivoting movement on opposite sides of heatsink base 558, which supports heatsink 515. Each latch arm 570 has a latching surface 554. First pair of spring-loaded latch arms 570 are on each end of a first lateral side of heatsink base 558 and are aligned for rotational movement about a first horizontal axis that is parallel to the first lateral side. A first actuator lever member 571 is attached between first pair of spring-loaded latch arms 570. The first actuator lever member 571 is movable to simultaneously engage and disengage each of the first pair of spring-loaded latching arms 570 from the corresponding engagement feature 568 of the corresponding one of the mounting studs 564. A compression spring 572 is positioned between actuator lever member 571 and heatsink 515. Compression spring 572 provides spring loading to the latching arms 570. Mounting studs 564 are aligned with corresponding peripheral, spaced apertures 552 in heatsink base 558. Mounting studs 564 are attached to a board mechanical assembly 544 that in turn is fastened to IHS board 546. Board mechanical assembly 544 surrounds CPU socket (148, FIG. 1). FIGS. 5A-5C illustrate the heatsink base 558 positioned for conical tips 566 of mounting studs 564 to begin to enter corresponding spaced apart apertures 552. FIGS. 6A-6C illustrate heatsink base 558 positioned lower for conical tips 566 of mounting studs 564 to begin to deflect latching arms 570 away from aperture 552. FIGS. 7A-7C illustrate heatsink base 558 positioned still lower, with engagement feature 568 still below latching arm 570 and loading screws 556 still not contacting captive loading nuts 553. FIGS. 8A-8C illustrate heatsink base 558 and the associated assembly with processor positioned at the engagement height, such that (i) CPU contacts are started, (ii) heatsink-to-CPU thermal interface has started, and (iii) and final loading can begin. Engagement feature 568 has engaged latching arm 570. Loading screws 556 are contacting captive loading nuts 553 and can be applied in any sequence. With the heatsink/cpu assembly now prevented from tipping by the heatsink retention apparatus 502, one loading nut 553 can be individually, fully tightened without causing damage. A procedure is not required to tighten each loading nut 553 only a portion of the travel at a time in a sequence. Screw disassembly can be in any sequence. Also, a user must intentionally depress lever member 571 toward heatsink 515 to unlatch latching arms 570 from mounting studs 564, and lift heatsink base 558 away from load screws 556.

For clarity, only two adjacent corners are engaged by spring-loaded latching arms 570. In one or more embodiments, which are not illustrated, a mirrored identical second pair of the spring-loaded latch arms are pinned for pivoting movement on the opposite sides of the heatsink base. The second pair of the spring-loaded latch arms would be on each end of a second lateral side of the heatsink base. The second pair of the spring-loaded latch arms would be aligned for rotational movement about a second horizontal axis that is parallel to the second lateral side and the first horizontal axis. A second actuator lever member is attached between the second pair of spring-loaded latch arms. The second actuator lever member is movable to simultaneously engage and disengage each of the second pair of spring-loaded arms from the corresponding engagement feature of the corresponding one of the mounting studs.

Figure 9:
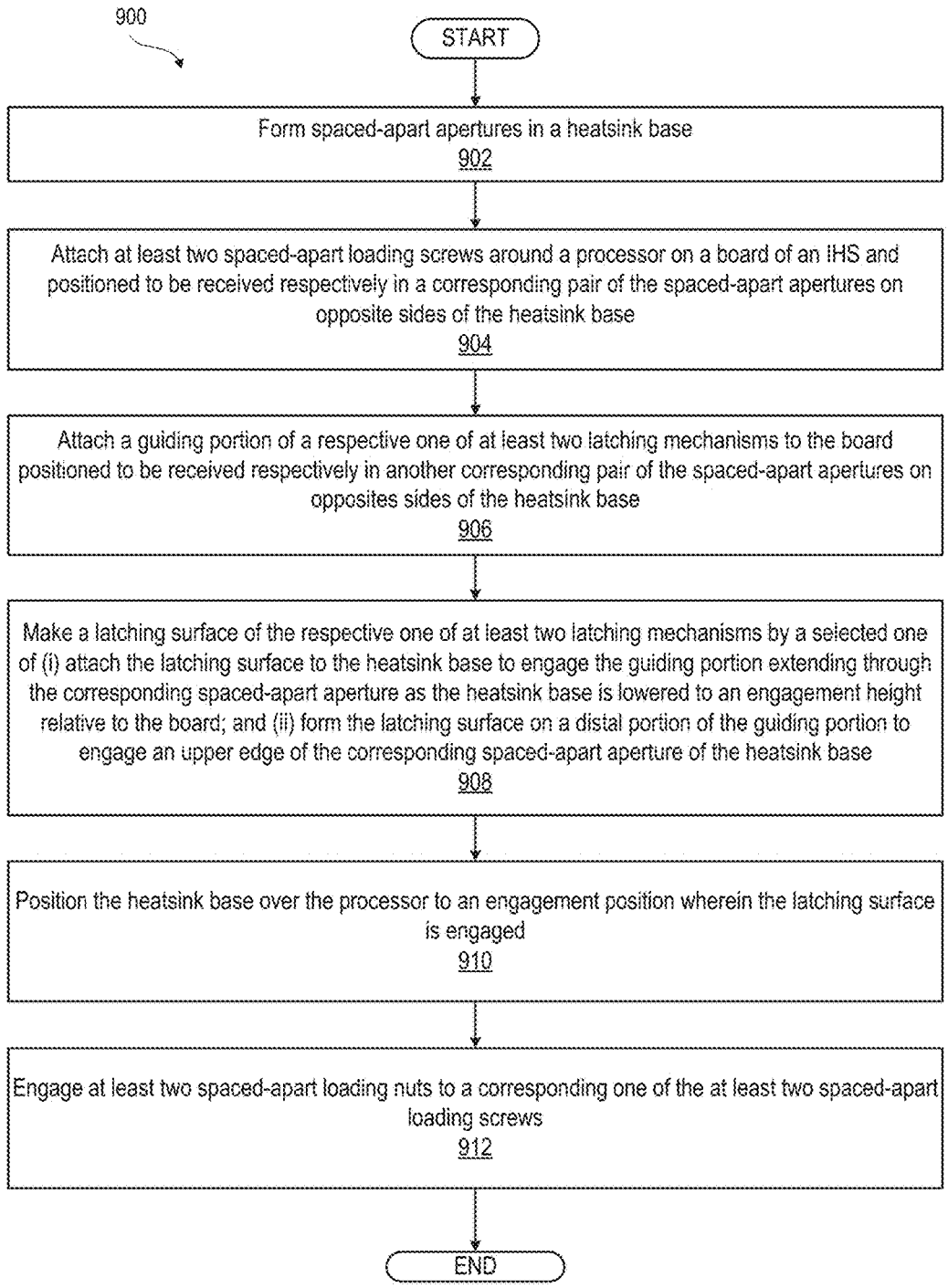
FIG. 9 illustrates a flow diagram of a method of automated assembling of an IHS board, according to one or more embodiments.
Figure 10:
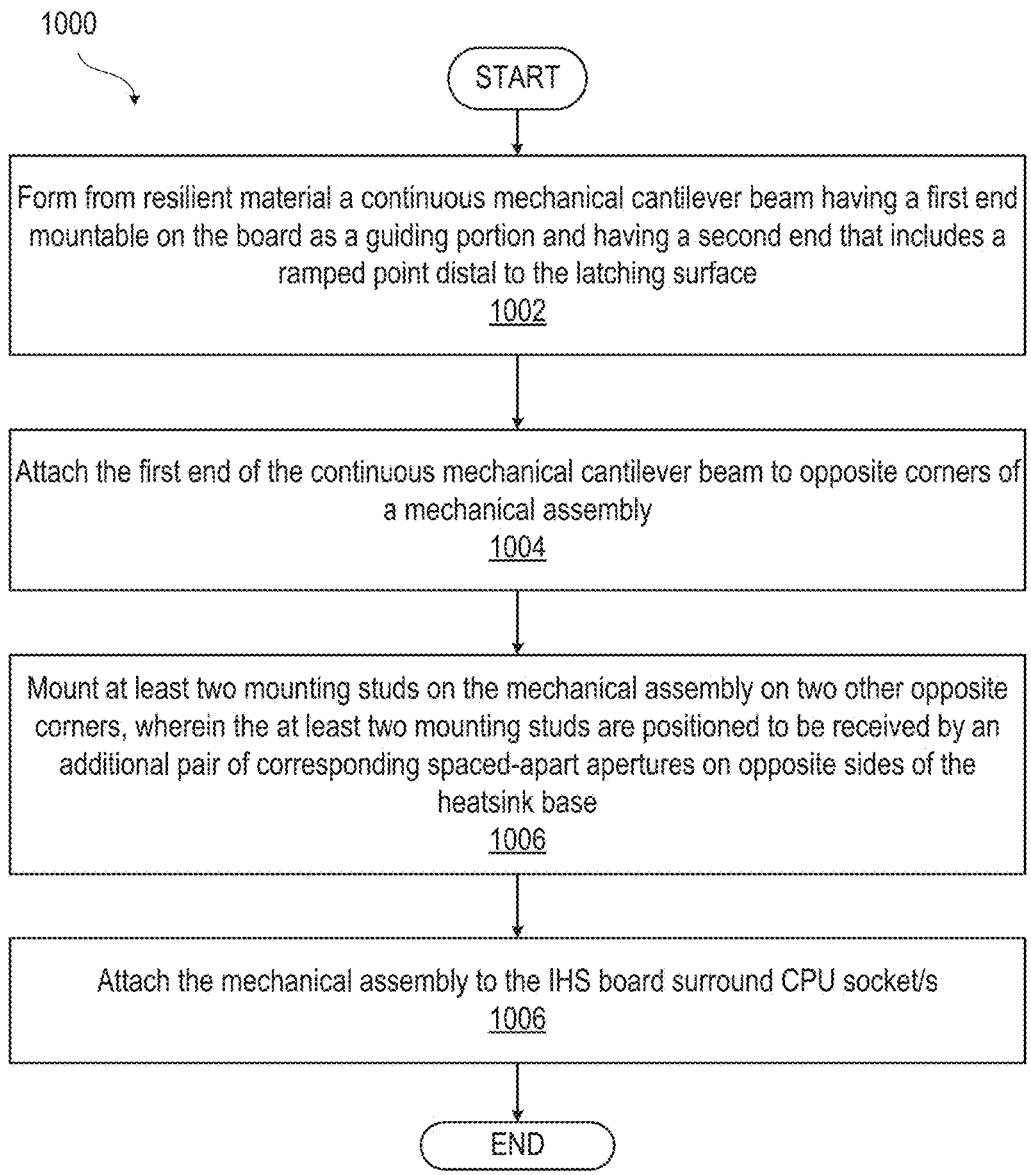
FIG. 10 illustrates a flow diagram of a method of making a continuous mechanical cantilever beam with latching surface for a first example heat sink apparatus, according to one or more embodiments.
Figure 11:
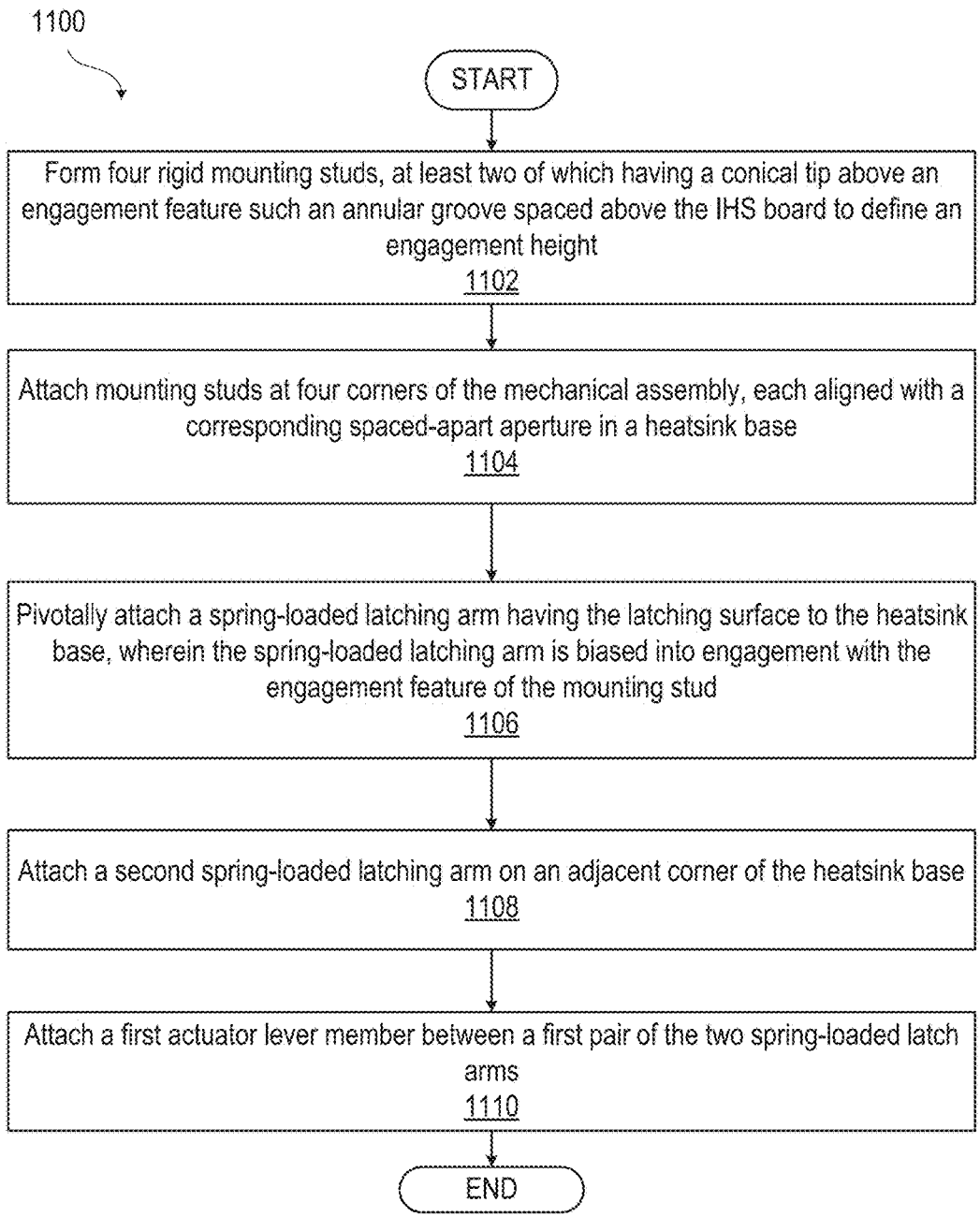
FIG. 11 illustrates a flow diagram of a method of making a second example heat sink apparatus utilizing a spring-biased latching arm, according to one or more embodiments.

FIGS. 9-11 illustrate flowcharts of exemplary methods 900, 1000, and 1100 by which an automated manufacturing controller 178 (FIG. 1) performs different aspects of the processes that enable the one or more embodiments of the disclosure. Generally, methods 900, 1000, and 1100 represent a computer-implemented method. The description of methods 900, 1000, and 1100 are provided with general reference to the specific components illustrated within FIG. 1. Generally methods 900, 1000, and 1100 are described as being implemented via processor 112 (FIG. 1). The methods 900, 1000, and 1100 thereby provide automated assembling of an IHS board. It is however appreciated that certain aspects of the described methods may be implemented via other processing devices and/or execution of other code.

FIG. 9 illustrates a method 900 for automated assembling of an IHS board. In one or more embodiments, method 900 includes forming peripheral, spaced apertures in a heatsink base (block 902). The method 900 includes attaching at least two loading screws around a processor on a board of an IHS and positioning the screws to be received respectively in a corresponding pair of the peripheral, spaced apertures on opposite sides of the heatsink base (block 904). The method 900 includes attaching a mounting portion of a respective one of at least two latching mechanisms to the board, the mounting portion positioned to be received respectively in another corresponding pair of the peripheral, spaced apertures on opposites sides of the heatsink base (block 906). The method 900 includes making a latching surface of the respective one of the at least two latching mechanisms by a selected one of (i) attaching the latching surface to the heatsink base to engage the mounting portion extending through the corresponding peripheral, spaced aperture as the heatsink base is lowered to an engagement height relative to the board; and (ii) forming the latching surface on a terminal portion of the mounting portion to engage an upper edge of the corresponding peripheral, spaced aperture of the heatsink base (block 908). The method 900 includes positioning the heatsink base over the processor to an engagement position where the latching surface is engaged (block 910). The method 900 includes engaging at least two loading nuts (block 912). The at least two loading screws are each sized to be engageable by the at least two loading nuts when the heatsink base is positioned not higher than the engagement height. The engaged at least two latching mechanisms prevent tipping of the heatsink base during loading of the at least two loading screws with the at least two spaced apart loading nuts. The method 900 ends.

FIG. 10 illustrates a method 1000 of making a first example heatsink retention apparatus for an IHS board. In one or more embodiments, the method 1000 includes forming from elastic material a continuous mechanical cantilever beam having a first end mountable on the board as a mounting portion and having a second end that includes a ramped point distal to the latching surface (block 1002). The method 1000 includes attaching the first end of the continuous mechanical cantilever beam to opposite corners of a board mechanical assembly (block 1004). Method 1000 can further include mounting at least two mounting studs on the board mechanical assembly on two other opposite corners, where the at least two mounting studs are positioned to be received by an additional pair of corresponding peripheral, spaced apertures on opposite sides of the heatsink base (block 1006). The method 1000 includes attaching the board mechanical assembly to the IHS board surrounding CPU socket/s (block 1008). Then method 1000 ends.

FIG. 11 illustrates a method 1100 of making a second example heatsink retention apparatus for an IHS board. In one or more embodiments, method 1100 includes forming four rigid mounting studs, at least two of which have a conical tip above an engagement feature (block 1102). For example, the engagement feature can be an annular groove spaced above the IHS board to define an engagement height of the heatsink retention apparatus. The method 1100 includes attaching mounting studs at four corners of the board mechanical assembly, each stud aligned with a corresponding peripheral, spaced aperture in a heatsink base (block 1104). Method 1100 includes pivotally attaching a spring-loaded latching arm having the latching surface to the heatsink base. The spring-loaded latching arm is biased into engagement with the engagement feature of the mounting stud (block 1106). The method 1100 includes attaching a second spring-loaded latching arm on an adjacent corner of the heatsink base (block 1108). A first pair of the two spring-loaded latch arms on opposite sides of the heatsink base are on each end of a first lateral side of the heatsink base, and aligned for rotational movement about a first horizontal axis that is parallel to the first lateral side. Method 1100 includes attaching a first actuator lever member between the first pair of spring-loaded latch arms (block 1110). The first actuator lever members are movable to simultaneously engage and disengage each of the first pair of spring-loaded arms from the corresponding engagement feature of the corresponding one of the mounting studs. Then method 1100 ends.

In the above described flow charts of FIGS. 9-11, one or more of the methods may be embodied in an automated manufacturing controller that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. An information handling system (IHS) comprising:
   a heatsink retention apparatus comprising:
     a heatsink base having peripheral, spaced apertures;
     a board having at least two peripheral, spaced loading screws mounted thereon, the loading screws received respectively in a corresponding pair of the peripheral, spaced apertures of the heatsink base;
     at least two latching mechanisms comprising:
       a mounting portion mounted to the board and received respectively in another corresponding pair of the peripheral, spaced apertures of the heatsink base;

a first pair of spring-loaded latch arms pinned for pivoting movement on opposite sides of the heatsink base on each end of a first lateral side of the heatsink base and aligned for rotational movement about a first horizontal axis that is parallel to the first lateral side; and a latching surface that is mounted to one of (i) the heatsink base to engage the mounting portion extending through the corresponding peripheral, spaced aperture as the heatsink base is lowered to an engagement height relative to the board and (ii) a terminal portion of the mounting portion to engage an upper edge of the corresponding peripheral, spaced aperture of the heatsink base; and at least two peripheral, spaced loading nuts that engage for loading a corresponding one of the at least two peripheral, spaced loading screws, the at least two peripheral, spaced loading screws each sized to be engageable by the at least two peripheral, spaced loading nuts when the heatsink base is positioned not higher than the engagement height, the engaged at least two latching mechanisms preventing tipping of the heatsink base during loading of the at least two peripheral, spaced loading screws with the at least two spaced apart loading nuts.

2. The IHS of claim 1, wherein the mounting portion of each of the at least two latching mechanisms comprises a continuous mechanical cantilever beam having a first end mounted on the board and a second end that includes a ramped point distal to the latching surface, the continuous mechanical cantilever beam elastically urge the latching surface into engagement with the upper edge surrounding the corresponding peripheral, spaced aperture.

3. The IHS of claim 2, further comprising at least two mounting studs mounted on the board and received by an additional pair of corresponding peripheral, spaced apertures on opposite sides of the heatsink base;

wherein the two continuous mechanical cantilever beams are simultaneously disengageable from the upper edge from the heatsink base enabling removal of the heatsink base from the board guided by the at least two mounting studs.

4. The IHS of claim 1, wherein:

the latching surface comprises a spring-loaded latch arm pivotally attached to the heatsink base and biased into engagement with an engagement feature of a mounting stud mounted on the board.

5. The IHS of claim 1, wherein the at least two latching mechanisms comprise:

a first actuator lever member attached between the first pair of spring-loaded latch arms and movable to simultaneously engage and disengage each of the first pair of spring-loaded arms from a corresponding engagement feature of a corresponding one of a pair of mounting studs mounted on the board.

6. The IHS of claim 1, wherein the at least two latching mechanisms further comprise:

a second pair of spring-loaded latch arms pinned for pivoting movement on the opposite sides of the heatsink base on each end of a second lateral side of the heatsink base and aligned for rotational movement about a second horizontal axis that is parallel to the second lateral side and the first horizontal axis; and a second actuator lever member attached between the second pair of spring-loaded latch arms and movable to simultaneously engage and disengage each of the second pair of spring-loaded arms from a corresponding engagement feature of a corresponding one of a pair of mounting studs mounted on the board.

7. A heatsink retention apparatus comprising:

a heatsink base having peripheral, spaced apertures;

at least two peripheral, spaced loading screws mounted on a board of an information handling system (IHS) and received respectively in a corresponding pair of the peripheral, spaced apertures of the heatsink base;

at least two latching mechanisms comprising:

a mounting portion mounted to the board and received respectively in another corresponding pair of the peripheral, spaced apertures of the heatsink base;

a first pair of spring-loaded latch arms pinned for pivoting movement on opposite sides of the heatsink base on each end of a first lateral side of the heatsink base and aligned for rotational movement about a first horizontal axis that is parallel to the first lateral side; and a latching surface that is mounted to one of (i) the heatsink base to engage the mounting portion extending through the corresponding peripheral, spaced aperture as the heatsink base is lowered to an engagement height relative to the board and (ii) a terminal portion of the mounting portion to engage an upper edge of the corresponding peripheral, spaced aperture of the heatsink base; and at least two peripheral, spaced loading nuts that engage for loading a corresponding one of the at least two peripheral, spaced loading screws, the at least two peripheral, spaced loading screws each sized to be engageable by the at least two peripheral, spaced loading nuts when the heatsink base is positioned not higher than the engagement height, the engaged at least two latching mechanisms preventing tipping of the heatsink base during loading of the at least two peripheral, spaced loading screws with the at least two spaced apart loading nuts.

8. The heatsink retention apparatus of claim 7, wherein the mounting portion of each of the at least two latching mechanisms comprises a continuous mechanical cantilever beam having a first end mounted on the board and a second end that includes a ramped point distal to the latching surface, the continuous mechanical cantilever beam elastically urge the latching surface into engagement with the upper edge surrounding the corresponding peripheral, spaced aperture.

9. The heatsink retention apparatus of claim 8, further comprising:

at least two mounting studs mounted on the board and received by an additional pair of corresponding peripheral, spaced apertures on opposite sides of the heatsink base; and wherein the two continuous mechanical cantilever beams are simultaneously disengageable from the upper edge from the heatsink base enabling removal of the heatsink base from the board guided by at the least two mounting studs.

10. The heatsink retention apparatus of claim 7, wherein:

the mounting portion of each of the at least two latching mechanisms comprises a mounting stud having an engagement feature that is exposed above the corresponding peripheral, spaced aperture with the heatsink base at the engagement height; and the latching surface comprises a spring-loaded latch arm pivotally attached to the heatsink base and biased into engagement with an engagement feature of the mounting stud mounted on the board.

11. The heatsink retention apparatus of claim 7, wherein the at least two latching mechanisms comprise:
   a first actuator lever member attached between the first pair of spring-loaded latch arms and movable to simultaneously engage and disengage each of the first pair of spring-loaded arms from a corresponding engagement feature of a corresponding one of the mounting studs.

12. The heatsink retention apparatus of claim 7, wherein the at least two latching mechanisms further comprise:
   a second pair of spring-loaded latch arms pinned for pivoting movement on the opposite sides of the heatsink base on each end of a second lateral side of the heatsink base and aligned for rotational movement about a second horizontal axis that is parallel to the second lateral side and the first horizontal axis; and
   a second actuator lever member attached between the second pair of spring-loaded latch arms and movable to simultaneously engage and disengage each of the second pair of spring-loaded arms from the corresponding engagement feature of the corresponding one of the mounting studs.

13. A method of automated assembling of an information handling system (IHS) board, the method comprising:
   forming peripheral, spaced apertures in a heatsink base;
   attaching at least two peripheral, spaced loading screws around a processor on a board of an IHS and positioned to be received respectively in a corresponding pair of the peripheral, spaced apertures on opposite sides of the heatsink base;
   attaching a mounting portion of a respective one of at least two latching mechanisms to the board positioned to be received respectively in another corresponding pair of the peripheral, spaced apertures on opposites sides of the heatsink base;
   pinning for pivoting movement a first pair of spring-loaded latch arms on opposite sides of the heatsink base, on each end of a first lateral side of the heatsink base, and aligned for rotational movement about a first horizontal axis that is parallel to the first lateral side;
   making a latching surface of the respective one of at least two latching mechanisms by a selected one of:
      (i) attaching the latching surface to the heatsink base to engage the mounting portion extending through the corresponding peripheral, spaced aperture as the heatsink base is lowered to an engagement height relative to the board; and
      (ii) forming the latching surface on a terminal portion of the mounting portion to engage an upper edge of the corresponding peripheral, spaced aperture of the heatsink base;
   positioning the heatsink base over the processor to an engagement position wherein the latching surface is engaged; and
   engaging at least two peripheral, spaced loading nuts to a corresponding one of the at least two peripheral, spaced loading screws, the at least two peripheral, spaced loading screws each sized to be engageable by the at least two peripheral, spaced loading nuts when the heatsink base is positioned not higher than the engagement height, the engaged at least two latching mechanisms preventing tipping of the heatsink base during loading of the at least two peripheral, spaced loading screws with the at least two spaced apart loading nuts.

14. The method of claim 13, wherein the mounting portion of each of the at least two latching mechanisms comprises a continuous mechanical cantilever beam having a first end mounted on the board and a second end that includes a ramped point distal to the latching surface, the continuous mechanical cantilever beam elastically urge the latching surface into engagement with the upper edge surrounding the corresponding peripheral, spaced aperture.

15. The method of claim 14, further comprising mounting at least two mounting studs mounted on the board positioned to be received by an additional pair of corresponding peripheral, spaced apertures on opposite sides of the heatsink base.

16. The method of claim 15, further comprising deflecting the two continuous mechanical cantilever beams to simultaneously disengage from the upper edge from the heatsink base while raising the heatsink base away from the board guided by the at least two mounting studs for replacing the heatsink base.

17. The method of claim 13, wherein:
   mounting the mounting portion comprises forming a mounting stud having an engagement feature that is exposed above the corresponding peripheral, spaced aperture with the heatsink base at the engagement height; and
   attaching the latching surface comprises pivotally attaching the spring-loaded latch arm to the heatsink base and biasing the spring-loaded latch arm into engagement with the engagement feature of the mounting stud.

18. The method of claim 13, wherein attaching the at least two latching mechanisms comprises:
   attaching a first actuator lever member between the first pair of spring-loaded latch arms and movable to simultaneously engage and disengage each of the first pair of spring-loaded arms from the corresponding engagement feature of the corresponding one of the mounting studs.

19. The method of claim 13, wherein attaching the at least two latching mechanisms further comprises:
   pinning for pivoting movement a second pair of spring-loaded latch arms on opposite sides of the heatsink base, on each end of a second lateral side of the heatsink base, and aligned for rotational movement about a second horizontal axis that is parallel to the first lateral side and parallel to the first horizontal axis; and
   attaching a second actuator lever member between the first pair of spring-loaded latch arms and movable to simultaneously engage and disengage each of the second pair of spring-loaded arms from the corresponding engagement feature of the corresponding one of the mounting studs.

20. The method of claim 18, further comprising replacing a mounted heatsink by:
   unlocking a pair of loading nuts to disengage loading screws from the heatsink base; and
   deflecting the first actuator lever members toward the heatsink to disengage the spring-loaded latch arms from the engagement feature of the corresponding one of the mounting studs while simultaneously removing the heatsink base to replace a heatsink.

* * * * *